(12) United States Patent
Hirose et al.

(10) Patent No.: US 7,745,923 B2
(45) Date of Patent: Jun. 29, 2010

(54) COVER SUBSTRATE ATTACHED TO A RIM SUBSTRATE WITH ELECTRICALLY CONNECTED THROUGH HOLE

(75) Inventors: Yukie Hirose, Yokosuka (JP); Yasuhiro Fukuyama, Yokosuka (JP); Makoto Iwashima, Yokosuka (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 446 days.

(21) Appl. No.: 11/806,381

(22) Filed: May 31, 2007

(65) Prior Publication Data
US 2007/0278649 A1   Dec. 6, 2007

(30) Foreign Application Priority Data
Jun. 2, 2006   (JP) .............................. 2006-154920

(51) Int. Cl.
H01L 23/04 (2006.01)
H01R 12/16 (2006.01)
H01L 21/00 (2006.01)

(52) U.S. Cl. .................. 257/698; 257/724; 257/774; 257/775; 361/790; 361/792; 438/107

(58) Field of Classification Search .................. None
See application file for complete search history.

(56) References Cited

U.S. PATENT DOCUMENTS 5,122,856 A * 6/1992 Komiya ...................... 257/774

2005/0167795 A1 * 8/2005 Higashi ...................... 257/678

FOREIGN PATENT DOCUMENTS

JP   2005-251898 A   9/2005

* cited by examiner

*Primary Examiner*—Alonzo Chambliss
(74) *Attorney, Agent, or Firm*—Foley & Lardner LLP (57) ABSTRACT

A semiconductor package, includes: element substrate having first surface, including: functional element on first surface, and extracting electrode on first surface and configured to output a signal of functional element, extracting electrode being disposed around functional element; rim substrate shaped into a frame, and configured to have first junction with element substrate to surround functional element, rim substrate including: first through hole through rim substrate, and connecting electrode which is: formed by packing first through hole with first conductor material, configured to seal signal extracting aperture of extracting electrode, and configured to electrically connect signal extracting aperture with takeout electrode; and cover substrate configured to have second junction with rim substrate to block aperture of rim substrate, cover substrate including: second through hole through cover substrate, and takeout electrode which is: formed by packing second through hole with second conductor material, and configured to take out signal of functional element.

20 Claims, 12 Drawing Sheets

COVER SUBSTRATE ATTACHED TO A RIM SUBSTRATE WITH ELECTRICALLY CONNECTED THROUGH HOLE

BACKGROUND OF THE INVENTION

1. Field of the Invention

The present invention relates to a semiconductor package where a functional element formed on a first surface of an element substrate is sealed in a closed space. The present invention also relates to a method of producing the semiconductor package and a semiconductor package assembly.

2. Description of the Related Art

A wafer level package is known as a semiconductor package where a semiconductor element formed on a surface of a semiconductor element substrate is sealed in a closed space. In the above wafer level package, a substrate has a junction with a wafer formed with the semiconductor element, to thereby seal the semiconductor element in the closed space. Japanese Patent Application Laid-Open No 2005-251898 (=JP2005251898) discloses a conventional technology of a method of using solder for causing the substrate to have the junction with the wafer.

In the conventional wafer level package according to the JP2005251898, however, the solder is applied in such a manner as to surround the semiconductor element for the junction between the substrate and the wafer. By the way, the solder for the junction between the substrate and the wafer is made of metal. Therefore, for preventing the solder (for the above junction) from contacting an electrode pad of the semiconductor element, the solder and the electrode pad should be spaced apart. Therefore, the wafer level package according to the JP2005251898 is large, which is inconvenient.

SUMMARY OF THE INVENTION

It is an object of the present invention to provide a semiconductor package, a method of producing the same and a semiconductor package assembly.

According to a first aspect of the present invention, there is provided a semiconductor package, comprising: 1) an element substrate having a first surface, including: i) a functional element formed on the first surface, and ii) an extracting electrode formed on the first surface and configured to output a signal of the functional element, the extracting electrode being disposed around the functional element; 2) a rim substrate shaped substantially into a frame, and configured to have a first junction with the element substrate in such a manner as to surround the functional element, the rim substrate including: i) a first through hole through the rim substrate, and ii) a connecting electrode which is: formed by packing the first through hole with a first conductor material, configured to seal a signal extracting aperture of the extracting electrode, and configured to electrically connect the signal extracting aperture with a takeout electrode; and 3) a cover substrate configured to have a second junction with the rim substrate in such a manner as to block an aperture of the rim substrate, the cover substrate including: i) a second through hole through the cover substrate, and ii) the takeout electrode which is: formed by packing the second through hole with a second conductor material, and configured to take out the signal of the functional element.

According to a second aspect of the present invention, there is provided a semiconductor package assembly, comprising: 1) a plurality of the semiconductor packages according to claim 1 formed on one substrate substantially longitudinally and laterally in parallel, wherein the signal extracting aperture, the takeout electrode and the connecting electrode each of a first semiconductor package of the semiconductor packages are so configured as to be shared respectively with the signal extracting aperture, the takeout electrode and the connecting electrode each of a second semiconductor package adjacent to the first semiconductor package.

According to a third aspect of the present invention, there is provided a method of producing a semiconductor package which includes: 1) an element substrate having a first surface, including: i) a functional element formed on the first surface, and ii) an extracting electrode formed on the first surface and configured to output a signal of the functional element, the extracting electrode being disposed around the functional element, 2) a rim substrate shaped substantially into a frame, and configured to have a first junction with the element substrate in such a manner as to surround the functional element, and 3) a cover substrate configured to have a second junction with the rim substrate in such a manner as to block an aperture of the rim substrate, the method comprising: 1) forming a first through hole through the rim substrate; 2) injecting a first conductor material to the first through hole; 3) forming a second through hole through the cover substrate; and 4) injecting a second conductor material to the second through hole.

The other object(s) and feature(s) of the present invention will become understood from the following description with reference to the accompanying drawings.

BRIEF DESCRIPTION OF THE DRAWINGS

FIG. 1A is a plan view of an infrared ray sensor, according to a first embodiment of the present invention, while

FIG. 2A is a plan view of a rim substrate, while

FIG. 4A is plan view of an element substrate formed with an infrared ray sensing element, while

FIG. 5A shows a step for causing the rim substrate to have a first junction with the element substrate, while

FIG. 7A shows a step for injecting a first conductor material to the through hole of the rim substrate, while

FIG. 8A shows a step for causing a cover substrate to have a second junction with the rim substrate, while

FIG. 12A is a plan view of the infrared ray sensor according to the third embodiment, while

DESCRIPTION OF THE PREFERRED EMBODIMENTS

In the following, various embodiments of the present invention will be described in detail with reference to the accompanying drawings.

For ease of understanding, the following description will contain various directional terms, such as left, right, upper, lower, forward, rearward and the like. However, such terms are to be understood with respect to only a drawing or drawings on which the corresponding part of element is illustrated.

First Embodiment

<Structure of Infrared Ray Sensor 1>

Figure 1A:
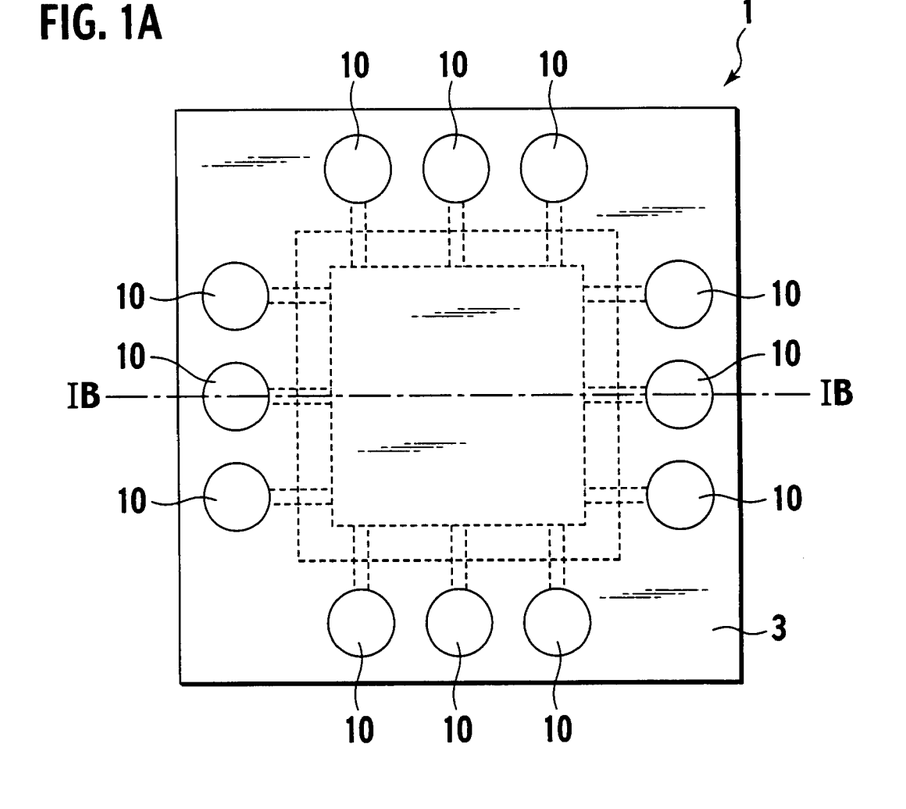
Figure 1B:
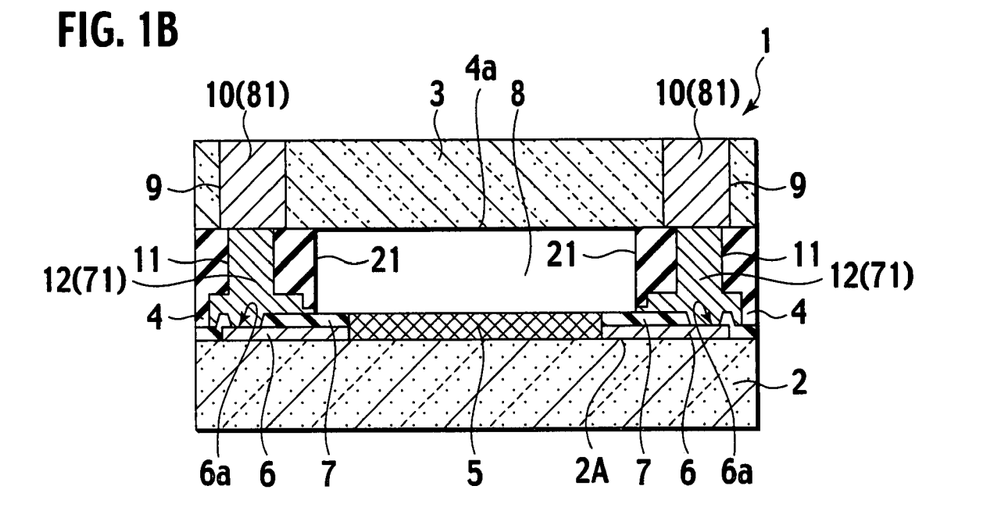
FIG. 1B is a cross sectional view taken along the line IB-IB in FIG. 1A.

An infrared ray sensor 1 (otherwise referred to as "semiconductor package 1") according to a first embodiment of the present invention is to be set forth, referring to FIG. 1A and FIG. 1B. FIG. 1A is a plan view of the infrared ray sensor 1, while FIG. 1B is a cross sectional view taken along the line IB-IB in FIG. 1A.

The infrared ray sensor 1 includes an element substrate 2, a cover substrate 3 and a rim substrate 4. The semiconductor element substrate 2 is made of, for example, Si, and has a first surface 2A formed with an infrared ray sensing element 5. The infrared ray sensing element 5 having a light receiver senses an infrared ray. Specifically, the infrared ray sensing element 5 senses the light receiver's temperature which is increased when the light receiver is irradiated with the infrared ray. An extracting electrode 6 for outputting a signal from the infrared ray sensing element 5 is disposed around the infrared ray sensing element 5. The extracting electrode 6 is made of metal such as Al, Cu and the like and has a PAD aperture 6a (otherwise referred to as "signal extracting aperture 6a") for taking out the signal from the infrared ray sensing element 5. In the extracting electrode 6, a region other than the PAD aperture 6a is covered with an insulating film 7.

The cover substrate 3 is made of, for example, ZnS, Ge, Si and the like which are capable of transmitting the infrared ray. The rim substrate 4 (to be described afterward) having an aperture 4a has a first junction with the semiconductor element substrate 2. Causing the cover substrate 3 to have a second junction with the rim substrate 4 in such a configuration as to cover the aperture 4a of the rim substrate 4 forms a space 8 between the infrared ray sensing element 5 and the cover substrate 3. The thus formed space 8 seals the infrared ray sensing element 5.

The cover substrate 3 has a second through hole 9. Packing the second through hole 9 with a second conductor material 81 forms a takeout electrode 10. Via a wire or a bump, the takeout electrode 10 is connected to a circuit substrate where the infrared ray sensor 1 is installed.

The rim substrate 4 is made of machineable insulative material such as glass, insulative ceramic, silicon and the like, and is shaped into a frame-like plate. The rim substrate 4 is configured to surround the infrared ray sensing element 5. The rim substrate 4 also has a through hole, that is, a first through hole 11. Packing the first through hole 11 with a first conductor material 71 forms a connecting electrode 12. The connecting electrode 12 connects the PAD aperture 6a of the element substrate 2 with the takeout electrode 10 of the cover substrate 3. Moreover, the connecting electrode 12 seals the extracting electrode 6 and the insulating film 7.

Figure 2A:
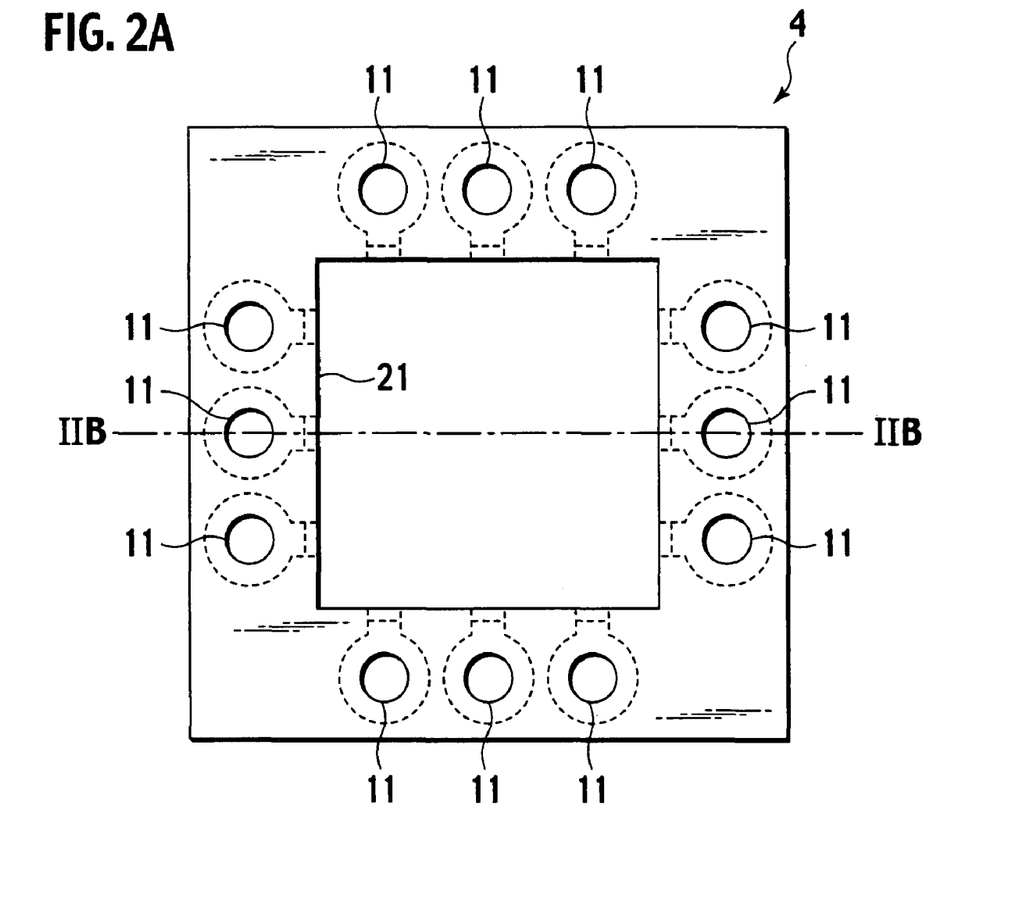
Figure 2B:
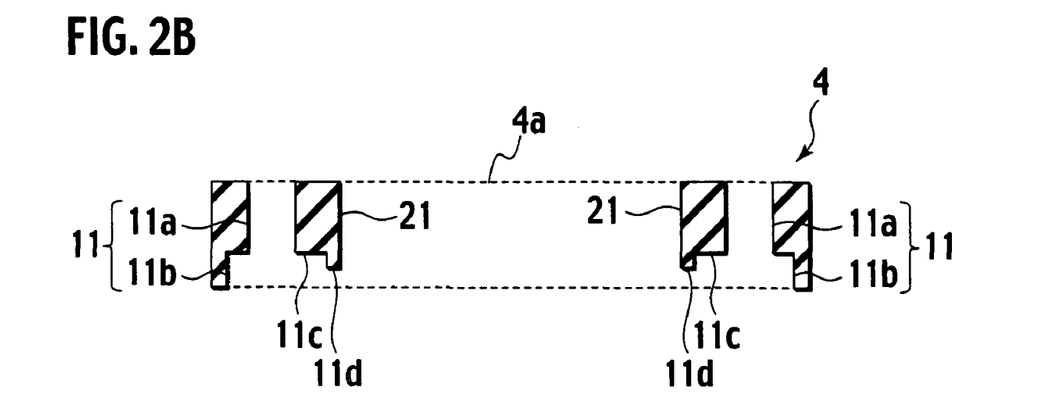
FIG. 2B is a cross sectional view taken along the line IIB-IIB in FIG. 2A.
Figure 3:
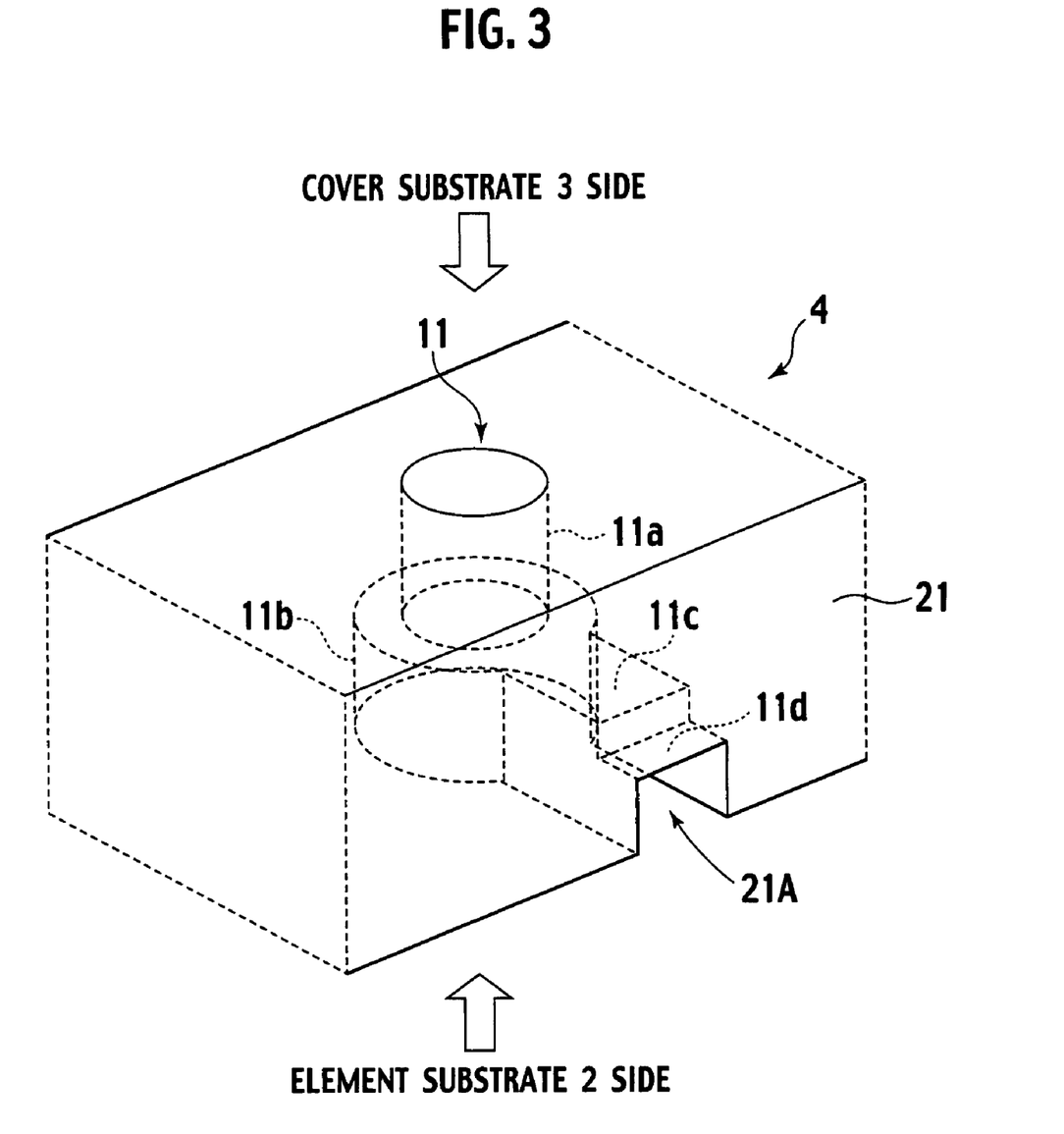
FIG. 3 is an enlarged perspective view of the rim substrate having a through hole.

Then, the first through hole 11 formed in the rim substrate 4 is to be set forth in detail, referring to FIG. 2 and FIG. 3. FIG. 2A is a plan view of the rim substrate 4, while FIG. 2B is a cross sectional view taken along the line IIB-IIB in FIG. 2A. FIG. 3 shows an enlarged perspective view of the first through hole 11. The first through hole 11 is not constant in cross section, that is, a first larger through hole 11b on the element substrate 2 side is larger in cross section than a first smaller through hole 11a on the cover substrate 3 side. The above difference in cross sectional scale is for sealing the extracting electrode 6 with the first conductor material 71 to be packed in the first through hole 11. Sealing the extracting electrode 6 with the first conductor material 71 is for the following cause: The extracting electrode 6 or the insulating film 7 causes irregularity to the first surface 2A of the element substrate 2, making it difficult to seal with the first junction (between the rim substrate 4 and the element substrate 2) a portion defining the extracting electrode 6 or the insulating film 7.

As shown in FIG. 2B and FIG. 3, a first recess 11c formed in the rim substrate 4 causes the first through hole 11 to communicate to an inner face 21 of the rim substrate 4. The above communication is for exhausting an air of the first through hole 11 which air may be caused when the first through hole 11 is in the process of being packed with the first conductor material 71, and for sealing with the first conductor material 71 an entirety of the extracting electrode 6's region covered with the rim substrate 4, in other words, not only a region adjacent to the PAD aperture 6a of the extracting electrode 6.

With the air exhausted from the first through hole 11, the first through hole 11 can be substantially completely packed with the first conductor material 71. Moreover, sealing with the first conductor material 71 the entirety of the extracting electrode 6's region covered with the rim substrate 4 can prevent impurity gas from remaining in or from occurring to a gap between the rim substrate 4 and the extracting electrode 6.

The recess formed in the rim substrate 4 is not constant in depth. Specifically, a second recess 11d adjacent to an outlet 21A of the inner face 21 is shallower than the first recess 11c. The non-constant first and second recesses 11c and 11d can prevent the first conductor material 71 from flowing into the infrared ray sensing element 5 when the first through hole 11 is in the process of being packed with the first conductor material 71.

<Method of Producing Infrared Ray Sensor 1>

Figure 4A:
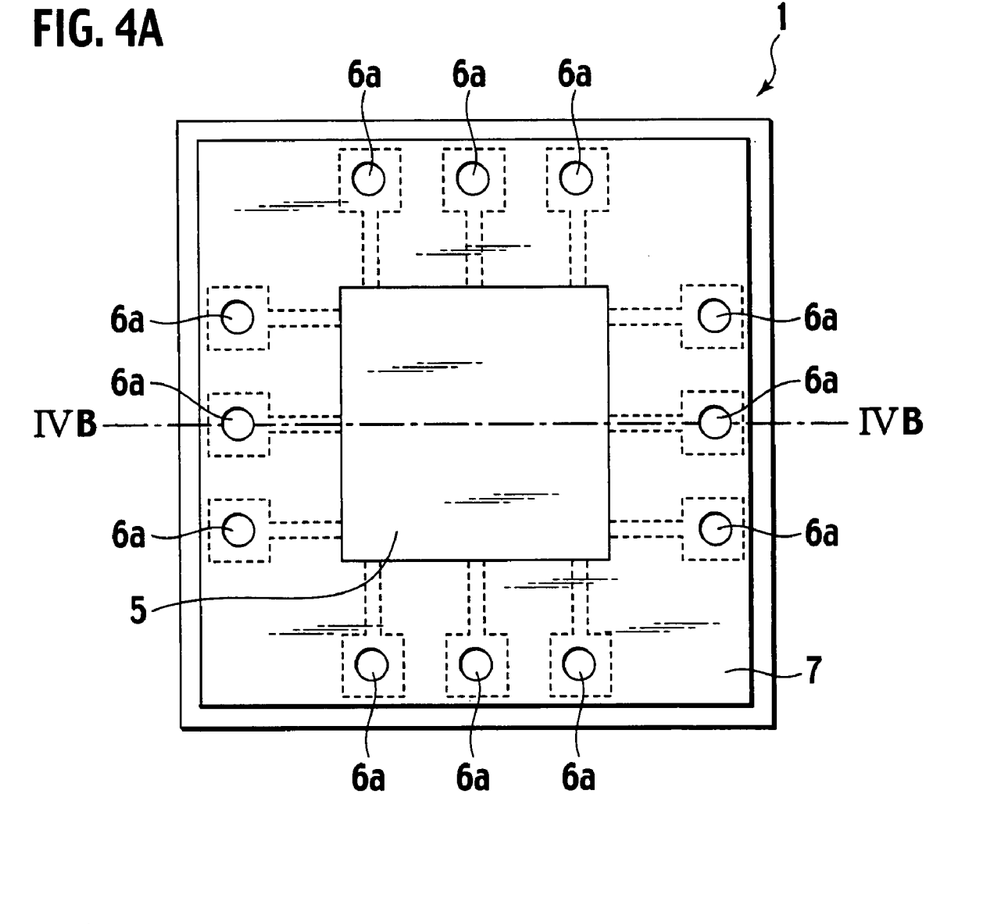
Figure 4B:
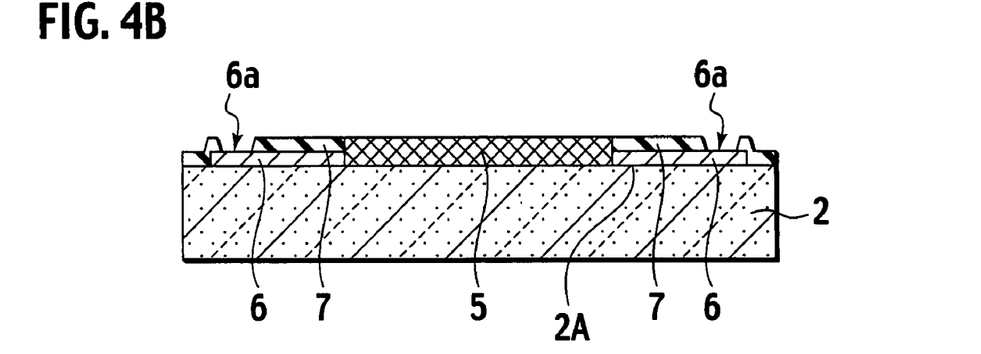
FIG. 4B is a cross sectional view taken along the line IVB-IVB in FIG. 4A.

Then, a method of producing the infrared ray sensor 1 is to be set forth, referring to FIG. 4A, FIG. 4B to FIG. 9. As shown in FIG. 4A and FIG. 4B, the infrared ray sensing element 5 is formed on the first surface 2A of the element substrate 2, by using a known micro-machining technology. Then, the extracting electrode 6 is formed around the infrared ray sensing element 5 through an embedding wiring technology. Moreover, the insulating film 7 is formed on a surface of the extracting electrode 6, to thereby form the PAD aperture 6a.

Figure 5A:
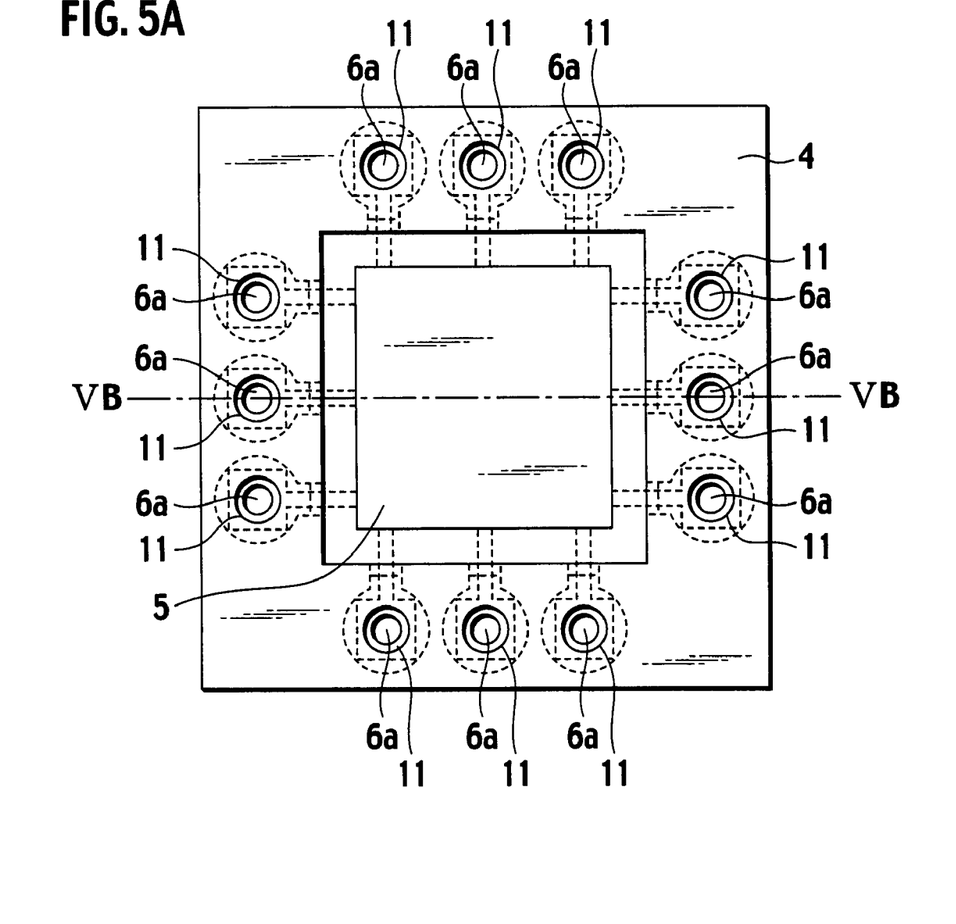
Figure 5B:
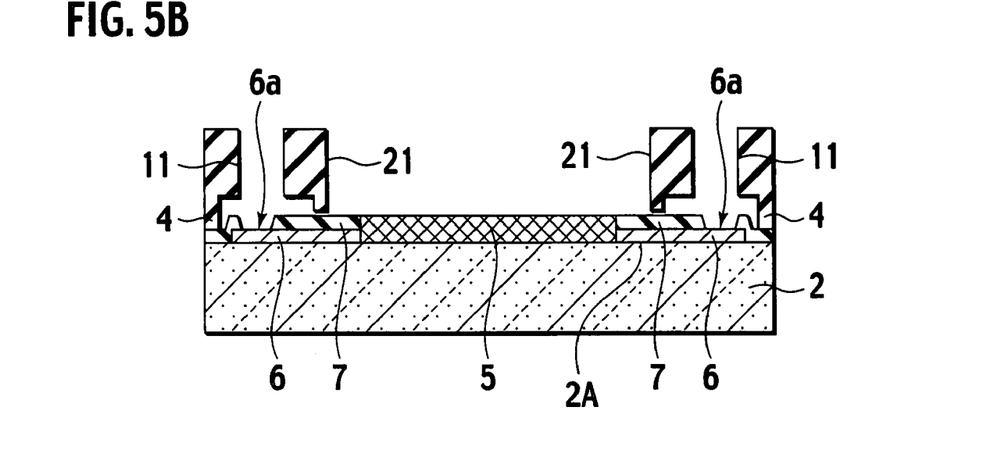
FIG. 5B is a cross sectional view taken along the line VB-VB in FIG. 5A.

Then, as shown in FIG. 5A and FIG. 5B, the rim substrate 4 formed with the first through hole 11 is caused to have the first junction with the element substrate 2 formed with the infrared ray sensing element 5. The first through hole 11 is formed through such operations as patterning (using mask), laser, sand blast and the like.

Figure 6:
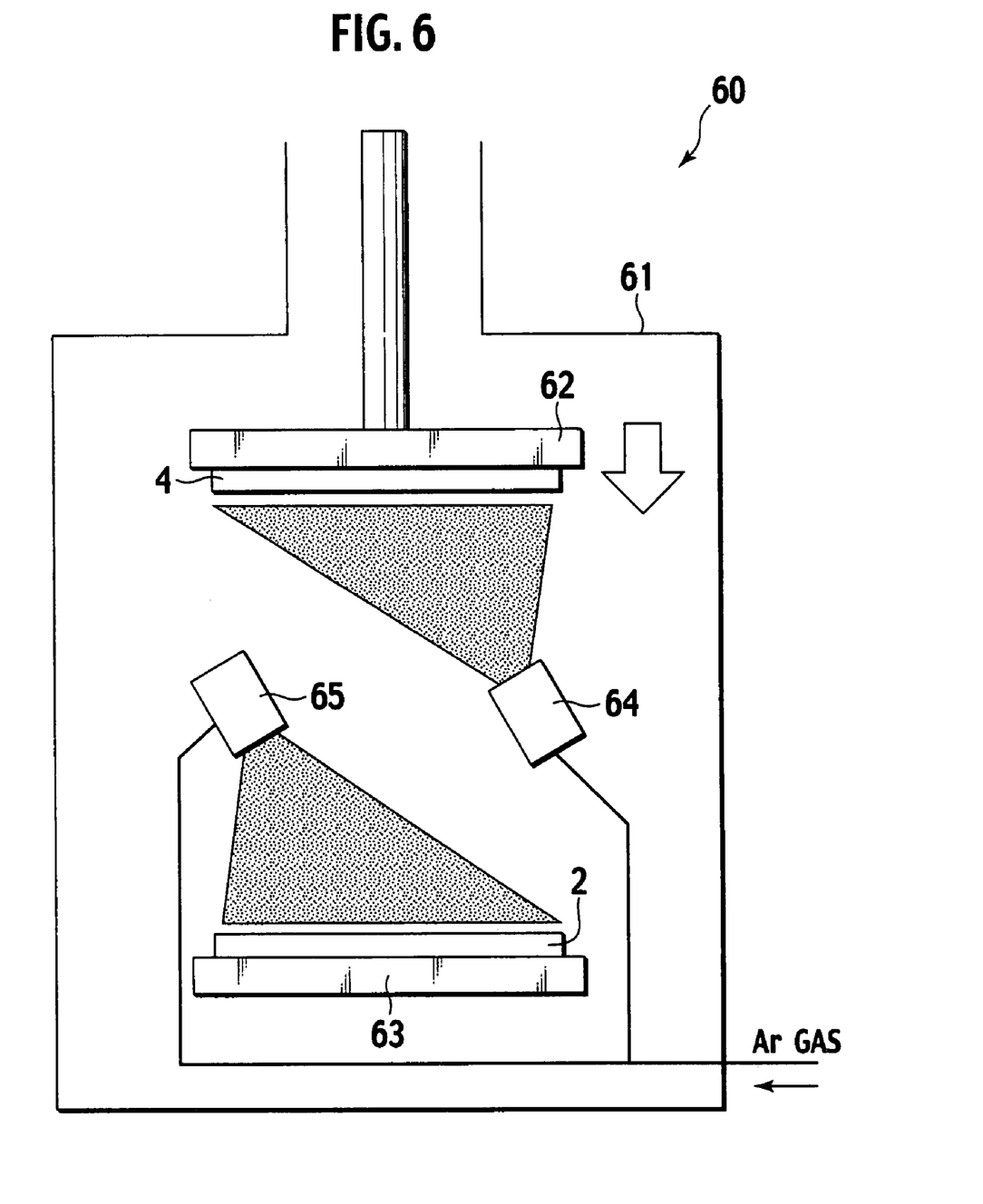
FIG. 6 shows a vacuum device for junction.

The first junction between the element substrate 2 and the rim substrate 4 is to be set forth, referring to FIG. 6. Setting the element substrate 2 and the rim substrate 4 in a chamber 61 of a vacuum device 60 can accomplish the first junction therebetween. The vacuum device 60 includes the chamber 61, an upper sample holder 62, a lower sample holder 63, a beam source 64 and a beam source 65. A vacuum pump (not shown) keeps the chamber 61 in a vacuum state from which the air is exhausted. The upper sample holder 62 is disposed on an upper side of the chamber 61, holding the rim substrate 4. The upper sample holder 62 is moveable upward and downward, in such a manner as to move the rim substrate 4 to a position for causing the rim substrate 4 to have the first junction with the element substrate 2. The lower sample holder 63 is disposed on a lower side of the chamber 61, holding the element substrate 2. The beam source 64 irradiates Ar ion beam (Ar gas) to the rim substrate 4 held by the upper sample holder 62, while the beam source 65 irradiates Ar ion beam to the element substrate 2 held by the lower sample holder 63.

Irradiating the Ar ion beam (Ar gas) to the rim substrate 4 causes a junction surface of the rim substrate 4 to be spattered or etched. Therefore, contaminant, moisture and the like covering the surface of the rim substrate 4 can be removed, thus activating the junction surface of the rim substrate 4. Meanwhile, irradiating the Ar ion beam to a junction surface (first surface 2A) of the element substrate 2 can also remove contaminant, oxidized film, hydroxyl group, moisture and the like which cover the surface, thus activating the junction surface of the element substrate 2.

After the irradiating of the Ar ion beam (Ar gas), the upper sample holder 62 is moved downward. Then, in the vacuum, overlapping the rim substrate 4 with the element substrate 2 with the respective junction surfaces thereof in the active state causes the element substrate 2 to have the first junction with the rim substrate 4 (surface activation junction).

Figure 7A:
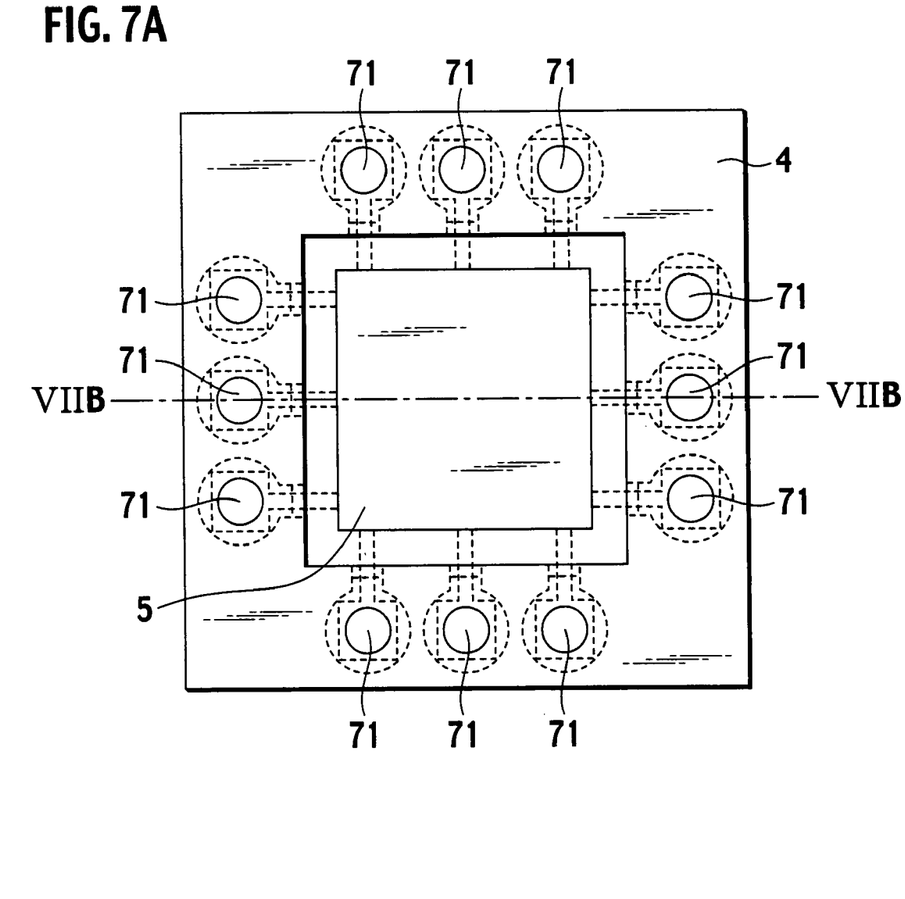
Figure 7B:
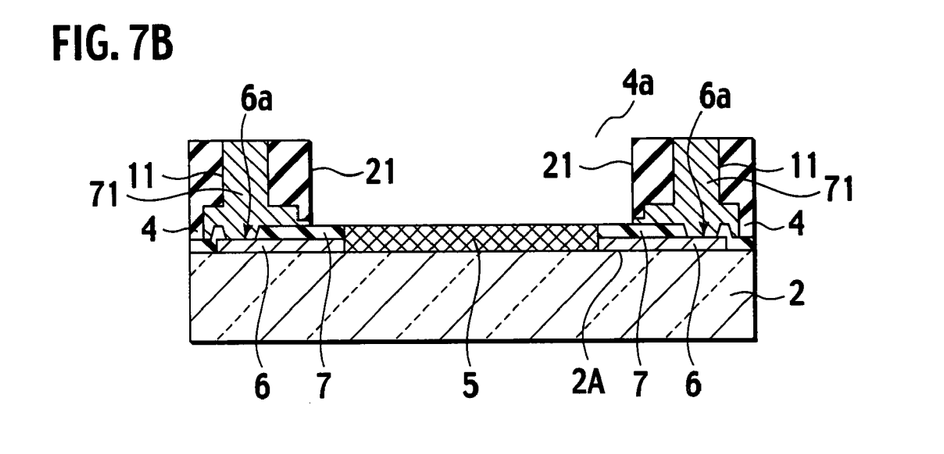
FIG. 7B is a cross sectional view taken along the line VIIB-VIIB in FIG. 7A.

Then, as shown in FIG. 7A and FIG. 7B, the fused first conductor material 71, for example, a solder is injected to the first through hole 11 of the rim substrate 4. Then, the above state is left at rest until the first conductor material 71 injected to the first through hole 11 is solidified.

Figure 8A:
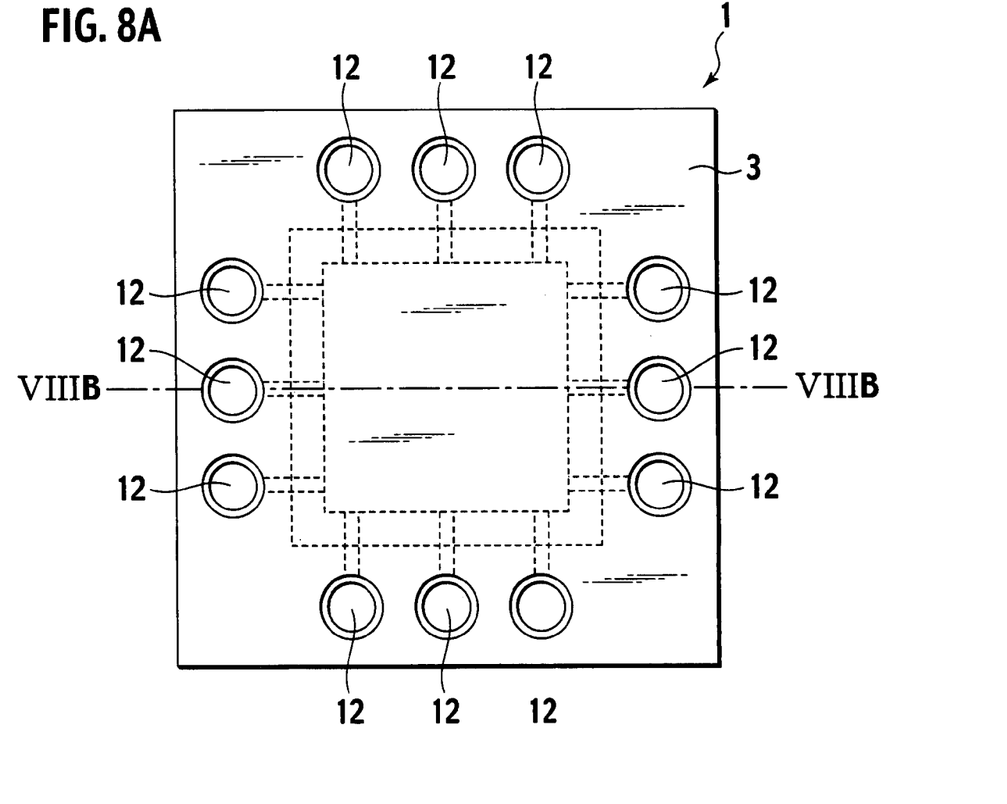
Figure 8B:
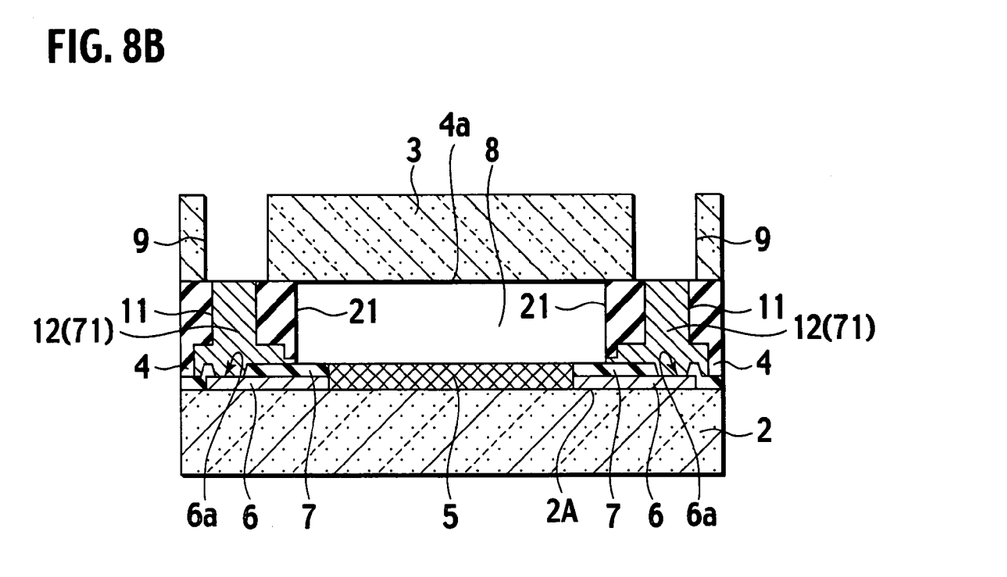
FIG. 8B is a cross sectional view taken along the line VIIIB-VIIIB in FIG. 8A.

Then, as shown in FIG. 8A and FIG. 8B, the cover substrate 3 formed with the second through hole 9 is caused to have a second junction with the rim substrate 4. In the cover substrate 3, the second through hole 9 has been formed in advance by drill, laser, sand blast and the like. The second junction between the cover substrate 3 and the rim substrate 4 is accomplished by a surface activation junction like the one used for accomplishing the first junction between the semiconductor element substrate 2 and the rim substrate 4.

After accomplishing the second junction between the cover substrate 3 and the rim substrate 4, the fused second conductor material 81, for example, a solder is injected to the second through hole 9 of the cover substrate 3. In this case, however, the second conductor material 81 injected to the second through hole 9 of the cover substrate 3 is lower in melting point than the first conductor material 71 injected to the first through hole 11 of the rim substrate 4. After the injecting of the second conductor material 81 to the second through hole 9, the above state is left at rest until the second conductor material 81 is solidified.

Figure 9:
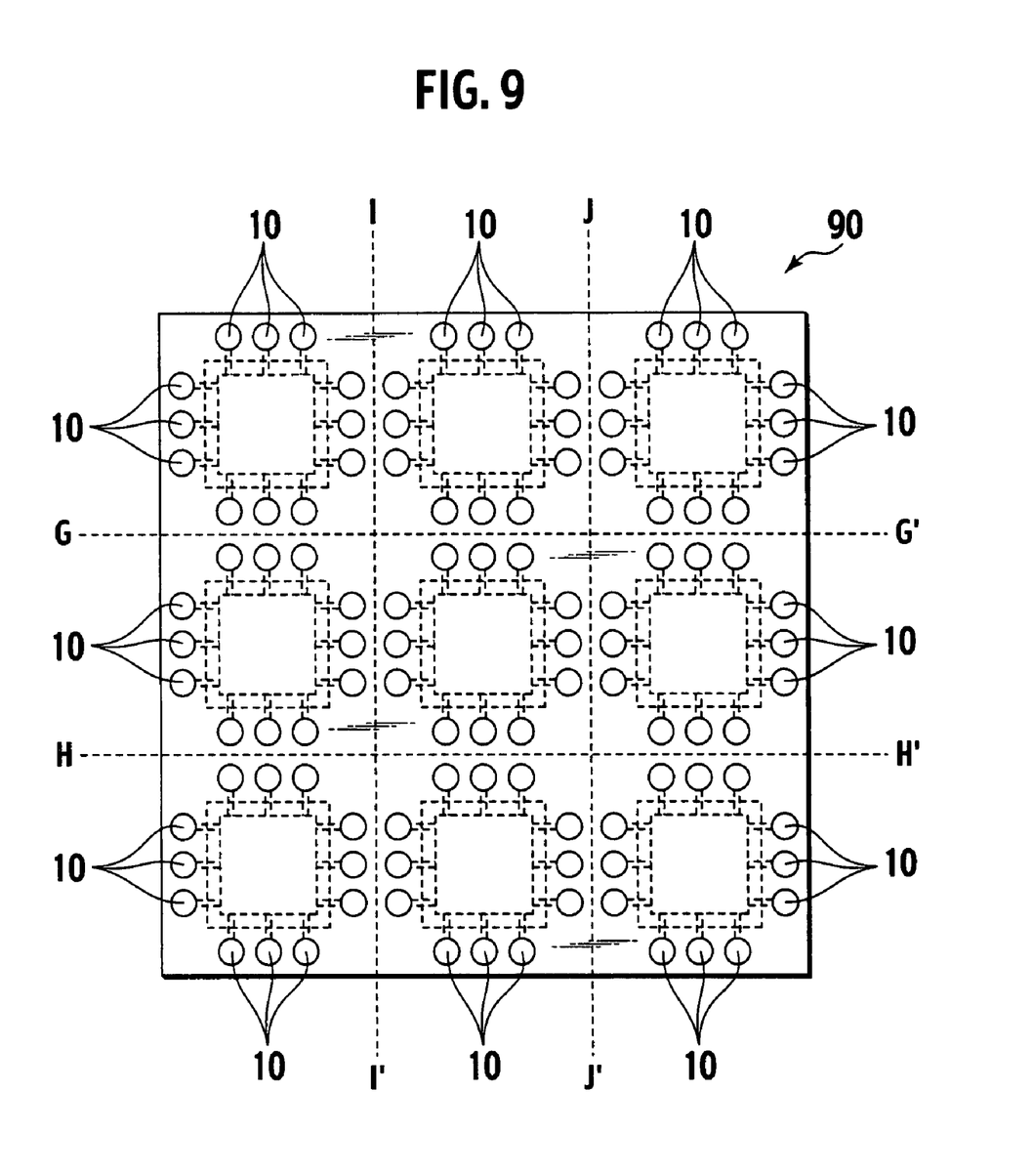
FIG. 9 explains a step for dicing an infrared ray sensor assembly into the infrared ray sensors.

In FIG. 2A, FIG. 2B to FIG. 8A, FIG. 8B, the element substrate 2 (one number), the cover substrate 3 (one number) and the rim substrate 4 (one number) form the infrared ray sensor 1. Actually, however, as shown in FIG. 9, the element substrate 2 (one number), the cover substrate 3 (one number) and the rim substrate 4 (one number) form a plurality of the infrared ray sensors 1 at once (i.e., bracket or batch). Hereinafter, an assembly of the plurality of the infrared ray sensors 1 formed at once (i.e., bracket or batch) is referred to as an infrared ray sensor assembly 90 (otherwise referred to as "semiconductor package assembly 90"). The infrared ray sensor assembly 90 has a plurality of the infrared ray sensors 1 arranged in parallel longitudinally and laterally. After the left-at-rest state where the second conductor material 81 is injected to the second through hole 9, as shown in FIG. 9, the infrared ray sensor assembly 90 is diced into pieces along the line G-G', the line H-H', the line I-I' and the line J-J', to thereby prepare the infrared ray sensor 1 in FIG. 1A and FIG. 1B.

The infrared ray sensor 1 according to the first embodiment brings about the following operations and effects.

(1) The rim substrate 4 formed with the first through hole 11 and the connecting electrode 12 formed by packing the first through hole 11 with the first conductor material 71 forms the space 8 between the element substrate 2 (formed with the infrared ray sensing element 5) and the cover substrate 3, thereby sealing the space 8 in the infrared ray sensing element 5.

Therefore, other than the region for sealing the infrared ray sensing element 5, a region for providing an electrode for taking out the signal out of the infrared ray sensing element 5 is not needed on the element substrate 2, thereby making the infrared ray sensor 1 compact.

(2) The second conductor material 81 for packing the second through hole 9 of the cover substrate 3 is lower in melting point than the first conductor material 71 for packing the first through hole 11 of the rim substrate 4.

Therefore, when injecting the second conductor material 81 to the second through hole 9 of the cover substrate 3, a possible elution of the first conductor material 71 from the connecting electrode 12 of the rim substrate 4 or a possible re-fusing of the connecting electrode 12 can be prevented.

(3) The first larger through hole 11b on the element substrate 2 side of the rim substrate 4 has the cross section large enough to include the portion (such as the PAD aperture 6a) formed with the element substrate 2's irregularity.

Therefore, the portion (such as the PAD aperture 6a) formed with the element substrate 2's irregularity can be sealed with the connecting electrode 12, thus making it possible to certainly seal a portion which is difficult to seal depending on the first junction between the element substrate 2 and the rim substrate 4.

(4) The first larger through hole 11b on the element substrate 2 side of the rim substrate 4 is larger in cross section than the first smaller through hole 11a on the cover substrate 3 side of the rim substrate 4.

Therefore, even enlarging the cross section of the first larger through hole 11b to such an extent that the connecting electrode 12 can seal the portion formed with the element substrate 2's irregularity can prevent a possible decrease in strength of the rim substrate 4 which decrease is attributable to the forming of the first through hole 11.

(5) The second through hole 9 of the cover substrate 3 is larger in cross section than the first smaller through hole 11a on the cover substrate 3 side of the rim substrate 4.

Therefore, even a slight positional change of the first through hole 11 of the rim substrate 4 can accomplish the electric connection between the connecting electrode 12 of the rim substrate 4 and the takeout electrode 10 of the cover substrate 3.

(6) On the first junction between the element substrate 2 and the rim substrate 4, the rim substrate 4 includes the first and second recesses 11c, 11d communicating to the inner face 21 of the rim substrate 4.

Therefore, the entirety of each of the extracting electrode 6's region and the insulating film 7's region which are covered with the rim substrate 4 can be sealed with the connecting conductor 12. With this, the space 8 for closing the infrared ray sensing element 5 can be certainly sealed.

Moreover, when the first conductor material 71 is injected to the first through hole 11, the air in the first through hole 11 is exhausted through the first recess 11c, thus packing the first through hole 11 with the first conductor material 71.

(7) The second recess 11d adjacent to the outlet 21A of the inner face 21 is shallower than the first recess 11c.

Therefore, when injected to the first through hole 11, the first conductor material 71 can be prevented from flowing to the infrared ray sensing element 5.

Moreover, the first conductor material 71 can be packed to adjacent to the inner face 21, thus certainly accomplishing the sealing with the connecting conductor 12.

Moreover, the connecting conductor 12 eliminates a gap between the rim substrate 4 and the insulating film 7, thereby decreasing quantity of an impurity gas adsorbed to a getter which may be provided in the space 8.

(8) Unlike a bump and the like pushed for junction, the rim substrate 4 shaped into a frame-like plate can keep in uniform a gap between the element substrate 2 and the cover substrate 3.

The infrared ray sensor 1 according to the first embodiment can be modified as set fort in the following paragraphs (1) to (6), including the paragraph (2) according to a second embodiment and the paragraph (6) according to a third embodiment:

(1) The functional element formed on the element substrate 2 is the infrared ray sensing element 5, but not limited thereto. Any other functional element formed on the element substrate 2 is allowed. For example, a pressure sensor element, an acceleration sensing element, a gyro element, and a CCD (Charge Coupled Device) are allowed. With these other functional elements, the element substrate 2 does not need to transmit the infrared ray, and therefore does not need to have infrared transmissivity.

Figure 10:
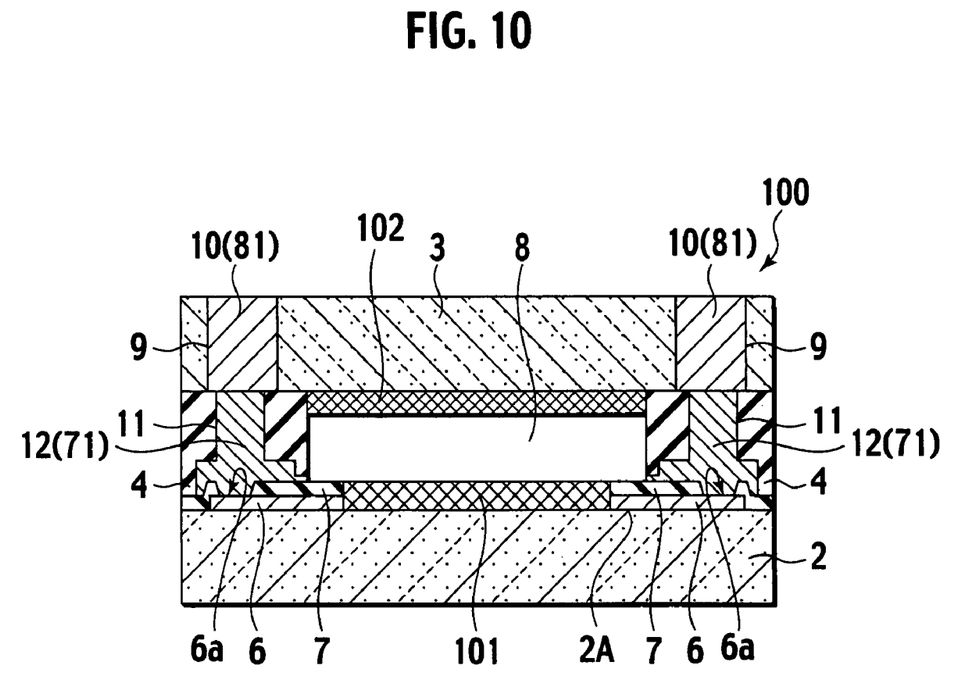
FIG. 10 shows a semiconductor package having a getter, according to a second embodiment of the present invention.

Second Embodiment (2) As shown in FIG. 10, a getter 102 for adsorbing the impurity gas may be provided in the space 8 defined by a functional element 101 of a semiconductor package 100. When the space 8 is closed to a vacuum state, the getter 102 can help keep a high vacuum level.

(3) For bettering the second through hole 9's wettability with the second conductor material 81, a surface of the second through hole 9 may be plated before the injecting of the second conductor material 81. The thus bettered second through hole 9's wettability with the second conductor material 81 can increase adhesion between the second conductor material 81 and the second through hole 9, thereby increasing packing property of the second conductor material 81. Moreover, likewise, a surface of the first through hole 11 of the rim substrate 4 may be plated.

(4) Other than the metal wiring, the extracting electrode 6 may be made through a poly Si wiring or a diffusion layer wiring.

(5) The first junction between the element substrate 2 and the rim substrate 4 and the second junction between the cover substrate 3 and the rim substrate 4 are accomplished by the surface activation junction. Otherwise, the above first and second junctions each may be accomplished by a positive electrode junction and the like.

Moreover, depending on the functional element, the first and second junctions each may be accomplished in an atmosphere rather than in the vacuum.

Figure 11:
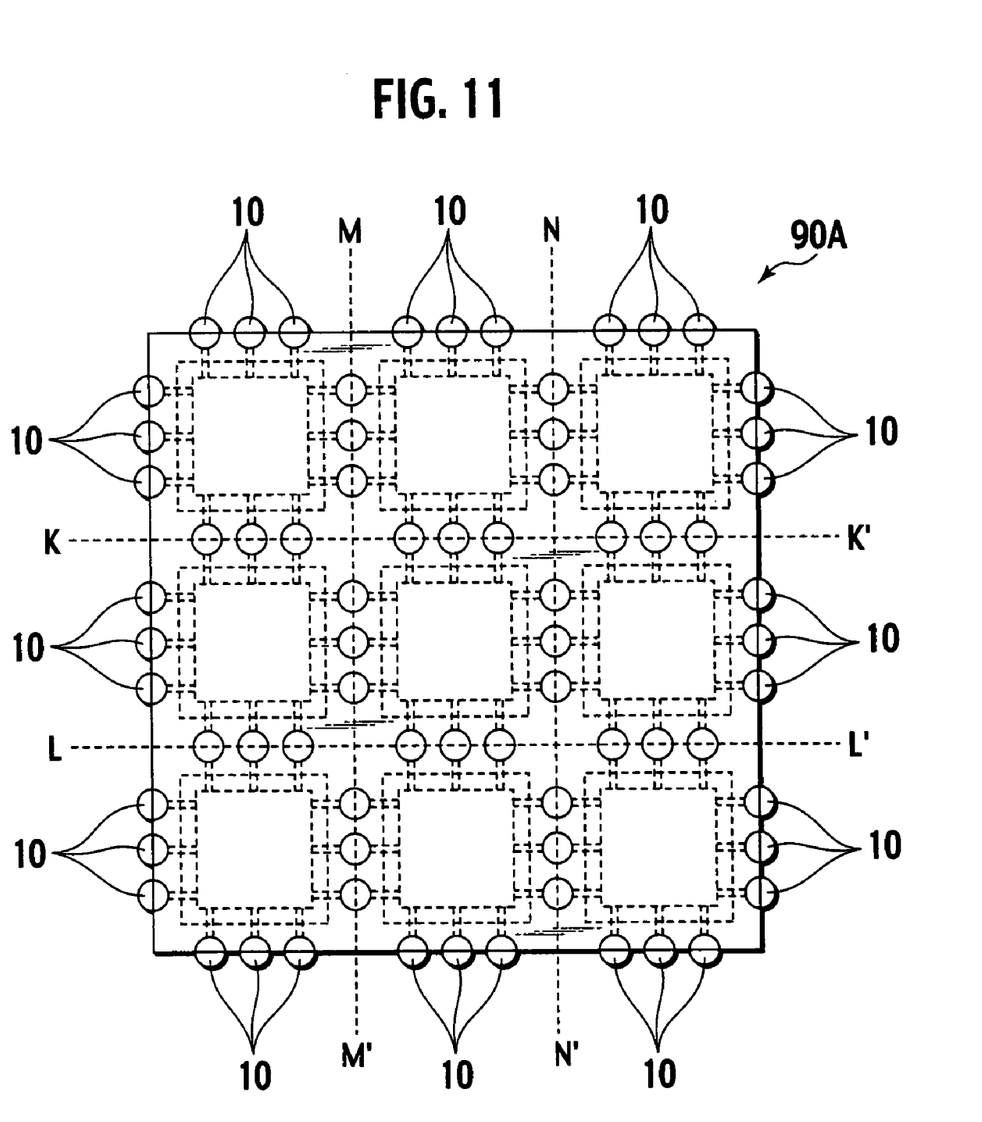
FIG. 11 explains a step for dicing an infrared ray sensor assembly into infrared ray sensors, according to a third embodiment of the present invention.

Third Embodiment (6) As shown in FIG. 11, adjacent infrared ray sensors of an infrared ray sensor assembly 90A (otherwise referred to as "semiconductor package assembly 90A") are so configured as to share the takeout electrode 10, the connecting electrode 12 (not shown) and the PAD aperture 6a (not shown). With the above structure, parts corresponding to the takeout electrode 10, the connecting electrode 12 (not shown) and the PAD aperture 6a (not shown) are diced into pieces along the line K-K', line L-L', the line M-M' and line N-N', to thereby obtain an infrared ray sensor 1A (otherwise referred to as "semiconductor package 1A") in FIG. 12A and FIG. 12B.

Figure 12A:
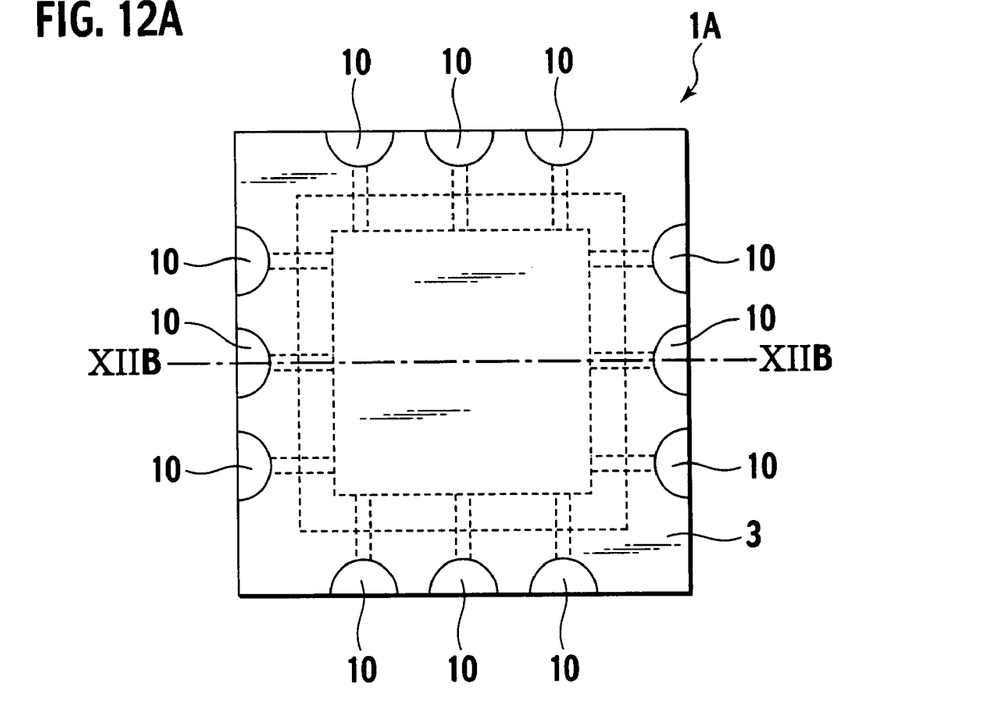
Figure 12B:
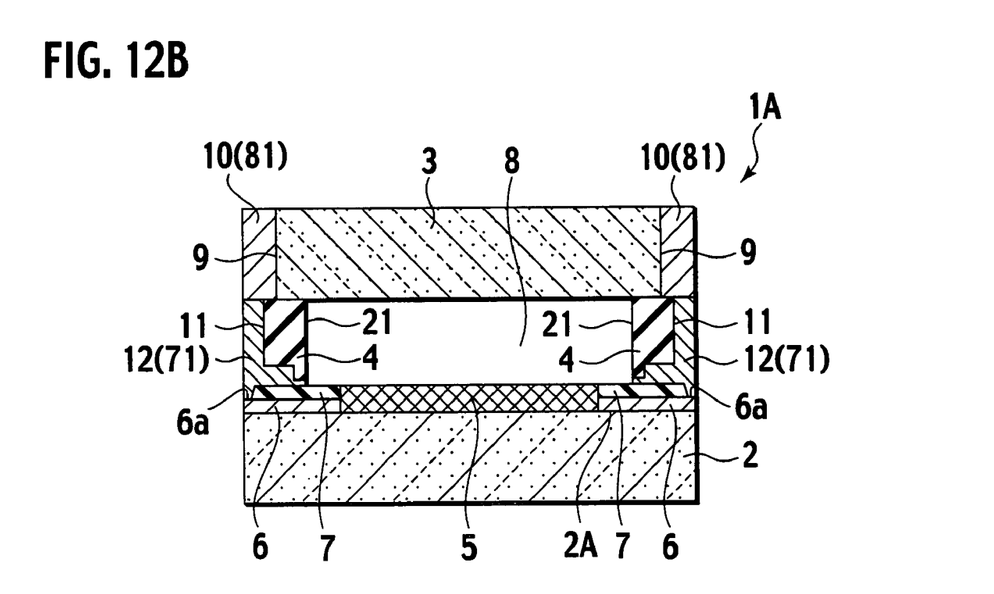
FIG. 12B is a cross sectional view taken along the line XIIB-XIIB in FIG. 12A.

Cutting the parts corresponding to the takeout electrode 10, the connecting electrode 12 (not shown), the PAD aperture 6a (not shown) leaves the first and second conductor materials 71, 81 packed respectively in the through holes 9, 11, thus keeping the space 8 closed. The above structure and operation according to the third embodiment can make the infrared ray sensor 1A smaller than the infrared ray sensor 1 according to the first embodiment.

Having the structural features described above, the present invention is not limited to any of the embodiments or modifications thereof described above.

This application is based on a prior Japanese Patent Application No. P2006-154920 (filed on Jun. 2, 2006 in Japan). The entire contents of the Japanese Patent Application No. P2006-154920 from which priority is claimed are incorporated herein by reference, in order to take some protection against translation errors or omitted portions.

The scope of the present invention is defined with reference to the following claims.

What is claimed is:

1. A semiconductor package, comprising:
1) an element substrate having a first surface, including:
   i) a functional element formed on the first surface, and
   ii) an extracting electrode formed on the first surface and configured to output a signal of the functional element, the extracting electrode being disposed around the functional element;
2) a rim substrate shaped substantially into a frame, and configured to have a first junction with the element substrate in such a manner as to surround the functional element, the rim substrate including:
   i) a first through hole through the rim substrate, and
   ii) a connecting electrode which is:
      formed by packing the first through hole with a first conductor material,
      configured to seal a signal extracting aperture of the extracting electrode, and
      configured to electrically connect the signal extracting aperture with a takeout electrode; and
3) a cover substrate configured to have a second junction with the rim substrate in such a manner as to block an aperture of the rim substrate, the cover substrate including:
   i) a second through hole through the cover substrate, and
   ii) the takeout electrode which is:

formed by packing the second through hole with a second conductor material, and configured to take out the signal of the functional element.

2. The semiconductor package according to claim 1, wherein the second conductor material for packing the second through hole is lower in melting point than the first conductor material for packing the first through hole.

3. The semiconductor package according to claim 1, wherein the first through hole has a cross section on the element substrate side larger than a cross section on the cover substrate side.

4. The semiconductor package according to claim 1, wherein the second through hole has a cross section larger than a cross section of the first through hole on the cover substrate side.

5. The semiconductor package according to claim 1, wherein the rim substrate includes a recess communicating to an inner face of the rim substrate along the extracting electrode on the first junction between the element substrate and the rim substrate, and the recess is packed with the first conductor material.

6. The semiconductor package according to claim 5, wherein the recess includes:
1) a first recess, and
2) a second recess shallower than the first recess and connected to the first recess in such a configuration as to be adjacent to the inner face.

7. The semiconductor package according to claim 1, wherein the functional element is an infrared ray sensing element.

8. The semiconductor package according to claim 1, wherein the functional element is selected from the group consisting of a pressure sensor element, an acceleration sensing element, a gyro element, and a charge coupled device.

9. The semiconductor package according to claim 1, further comprising:

a getter for absorbing an impurity gas, the getter being provided in a space defined by the functional element, wherein the getter is so configured as to keep a high vacuum level when the space is closed to a vacuum state.

10. The semiconductor package according to claim 1, wherein a surface of the first through hole is plated before the first conductor material is injected to the first through hole, and a surface of the second through hole is plated before the second conductor material is injected to the second through hole.

11. The semiconductor package according to claim 1, wherein the extracting electrode is made through the group consisting of a metal wiring, a poly Si wiring and a diffusion layer wiring.

12. The semiconductor package according to claim 1, wherein the first junction and the second junction each are configured to be accomplished by any of a surface activation junction and a positive electrode junction, and the first junction and the second junction each are configured to be accomplished in any of a vacuum and an atmosphere.

13. A semiconductor package assembly, comprising:
1) a plurality of the semiconductor packages according to claim 1 formed on one substrate substantially longitudinally and laterally in parallel, wherein the signal extracting aperture, the takeout electrode and the connecting electrode each of a first semiconductor package of the semiconductor packages are so configured as to be shared respectively with the signal extracting aperture, the takeout electrode and the connecting electrode each of a second semiconductor package adjacent to the first semiconductor package.

14. The semiconductor package assembly according to claim 13, wherein the semiconductor package assembly is configured to be diced into a plurality of the semiconductor packages.

15. The semiconductor package assembly according to claim 14, wherein the functional element is an infrared ray sensing element.

16. The semiconductor package assembly according to claim 13, wherein the functional element is selected from the group consisting of a pressure sensor element, an acceleration sensing element, a gyro element, and a charge coupled device.

17. A method of producing a semiconductor package which includes:
1) an element substrate having a first surface, including:
   i) a functional element formed on the first surface, and
   ii) an extracting electrode formed on the first surface and configured to output a signal of the functional element, the extracting electrode being disposed around the functional element,
2) a rim substrate shaped substantially into a frame, and configured to have a first junction with the element substrate in such a manner as to surround the functional element, and
3) a cover substrate configured to have a second junction with the rim substrate in such a manner as to block an aperture of the rim substrate, the method comprising:
1) forming a first through hole through the rim substrate;
2) injecting a first conductor material to the first through hole;
3) forming a second through hole through the cover substrate; and
4) injecting a second conductor material to the second through hole.

18. The method of producing the semiconductor package according to claim 17, wherein the rim substrate formed with the first through hole is caused to have the first junction with the element substrate, followed by the injecting of the first conductor material to the first through hole, and then, the cover substrate formed with the second through hole is caused to have the second junction with the rim substrate, followed by the injecting of the second conductor material to the second through hole.

19. The method of producing the semiconductor package according to claim 17, further comprising:
1) forming a recess communicating to an inner face of the rim substrate along the extracting electrode on the junction face between the element substrate and the rim substrate, and
2) packing the recess with the first conductor material.

20. The method of producing the semiconductor package according to claim 17, further comprising:
1) preparing a semiconductor package assembly which includes:

a plurality of the semiconductor packages on one substrate substantially longitudinally and laterally in parallel, wherein a signal extracting aperture, a takeout electrode and a connecting electrode each of a first semiconductor package of the semiconductor packages are shared respectively with a signal extracting aperture, a takeout electrode and a connecting electrode each of a second semiconductor package adjacent to the first semiconductor package, and 2) dicing the semiconductor package assembly into the plurality of the semiconductor packages.

* * * * *